(12) United States Patent
Park et al.

(10) Patent No.: US 12,218,155 B2
(45) Date of Patent: Feb. 4, 2025

(54) SEMICONDUCTOR DEVICE WITH MULTIPLE ZERO DIFFERENTIAL TRANSCONDUCTANCE AND METHOD OF MANUFACTURING SAME

(71) Applicant: RESEARCH & BUSINESS FOUNDATION SUNGKYUNKWAN UNIVERSITY, Suwon-si (KR)

(72) Inventors: Jin Hong Park, Hwaseong-si (KR); Jae Woong Choi, Suwon-si (KR); Je Jun Lee, Suwon-si (KR); Ju Hee Lee, Ansan-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 170 days.

(21) Appl. No.: 17/575,732

(22) Filed: Jan. 14, 2022

(65) Prior Publication Data
US 2022/0223630 A1    Jul. 14, 2022

(30) Foreign Application Priority Data
Jan. 14, 2021 (KR) .......................... 10-2021-0005577

(51) Int. Cl.
*H01L 27/12* (2006.01)
*H01L 29/66* (2006.01)
(52) U.S. Cl.
CPC ...... *H01L 27/1255* (2013.01); *H01L 29/6609* (2013.01)

(58) Field of Classification Search
CPC ............ H01L 27/1255; H01L 29/6609; H01L 29/66439; H01L 29/66469;
(Continued)

(56) References Cited

U.S. PATENT DOCUMENTS 9,076,874 B2 *   7/2015   Yamazaki ......... H01L 29/66969
2010/0258787 A1 * 10/2010  Chae ................ H01L 29/78684
                                                              257/39

(Continued)

OTHER PUBLICATIONS

Lu, Guanghao, et al. "Dual-Characteristic Transistors Based on Semiconducting Polymer Blends." Advanced Electronic Materials 2.10 (2016): 1600267, (7 pages in English).

(Continued)

*Primary Examiner* — Natalia A Gondarenko
(74) *Attorney, Agent, or Firm* — NSIP Law (57) ABSTRACT

A semiconductor device with multiple zero differential transconductance includes: a conductive substrate; a first insulating layer and a second insulating layer disposed on the conductive substrate; a first semiconductor and a second semiconductor disposed on first portions of the first insulating layer and the second insulating layer, respectively; a first buffer layer and a second buffer layer disposed on electrode contact areas of the first semiconductor and the second semiconductor, respectively; and an anode electrode and a cathode electrode disposed on second portions, which are different from the first portions, of the first insulating layer and the second insulating layer and on the first buffer layer and the second buffer layer, respectively, wherein the first semiconductor and the second semiconductor are disposed in parallel with each other and connected by the anode electrode and the cathode electrode.

18 Claims, 12 Drawing Sheets

(58) Field of Classification Search
CPC .......... H01L 29/78681; H01L 29/7869; H01L 29/78696; H01L 29/24; H01L 29/775; H01L 29/778; H01L 29/66606; H01L 29/66515; H01L 29/7839; H01L 29/78618–78627; H01L 29/122–127; H01L 29/803; H01L 29/0665; H01L 29/0649; H01L 29/0673; H01L 29/2253; H01L 29/66984; H01L 29/78; H01L 29/78684; H01L 29/786; H01L 29/78693; H01L 29/1606; H01L 29/16; H01L 29/161; H01L 29/18; H01L 29/247; H01L 29/267; H01L 29/4232; H01L 29/4236; H01L 29/42372; H01L 29/66; H01L 29/66015; H01L 29/66045; H01L 29/66477; H01L 21/28568; H01L 21/042; H01L 21/02527; H01L 21/02565
USPC .............. 257/211, 27, 29, 77, 288, E29.04, 257/E29.068, E29.082, E21.4; 438/285
See application file for complete search history.

(56) References Cited

U.S. PATENT DOCUMENTS

| | | | |
|---|---|---|---|
| 2012/0049193 A1* | 3/2012 | Saito | G02F 1/13454 257/66 |
| 2015/0340522 A1* | 11/2015 | Choi | H01L 31/032 257/432 |
| 2018/0358412 A1* | 12/2018 | Park | H10N 80/107 |
| 2018/0358446 A1* | 12/2018 | Park | H01L 29/1606 |
| 2019/0157272 A1* | 5/2019 | Oishi | H01L 21/84 |
| 2021/0359099 A1* | 11/2021 | Shen | H01L 29/45 |

OTHER PUBLICATIONS

Lim, Ji-Hye, et al. "Double Negative Differential Transconductance Characteristic: from Device to Circuit Application Toward Quaternary Inverter." Advanced Functional Materials 29.48 (2019): 1905540, (8 pages in English).

Korean Office Action issued on Mar. 29, 2022, in counterpart Korean Patent Application No. 10-2021-0005577 (4 pages in Korean).

* cited by examiner

SEMICONDUCTOR DEVICE WITH MULTIPLE ZERO DIFFERENTIAL TRANSCONDUCTANCE AND METHOD OF MANUFACTURING SAME

CROSS-REFERENCE TO RELATED APPLICATIONS

This application claims the benefit under 35 USC 119(a) and 365(b) of Korean Patent Application No. 10-2021-0005577 filed on Jan. 14, 2021, in the Korean Intellectual Property Office, the entire disclosure of which is incorporated herein by reference.

BACKGROUND

1. Field

The present disclosure relates to a semiconductor device with multiple zero differential transconductance and a method for manufacturing the same.

2. Description of the Related Art

A non-linear transconductance device may include a negative differential transconductance (NDT) device and a zero differential transconductance (ZDT) device. Among them, the negative differential transconductance device is a device having an N-shaped current-voltage characteristic and includes Esaki diode, a resonant tunneling diode, a single electron transistor, and the like.

The Esaki diode shows a characteristic in that the inter-band tunneling is easy in a heavily-doped p-n junction region such that, when a voltage applied to a p-region is increased, the tunneling current is decreased. Due to this characteristic, when a concentration of the channel material is low, the inter-band tunneling hardly occurs and, when the concentration is high, a diffusion current is dominant such that a negative differential curve may disappear. In the case of the structure of the resonance tunneling diode and the single electron transistor, a quantum well is formed between a source and a drain using nanowires, quantum dots, and the like. These structures form a peak current by adjusting a position of a quantized energy level in the quantum well by a gate voltage to implement a negative differential transconductance, but have limitations in that the process is complex and the operation is performed only at a low temperature.

In the meantime, a quantum dot gating FET (QDGFET) device, which is one of the zero differential transconductance devices, has a predetermined region, in which a drain current is constant with respect to a specific gate voltage change due to the quantized energy state of the quantum well formed in a gate insulating layer. However, as the energy increases, the energy level interval of a quantized status of a material sharply narrows, such that there is a limit to increasing a status of a material.

SUMMARY

The present disclosure relates to a semiconductor device with a multiple zero differential transconductance having a plurality of drain current saturation regions, in which the drain current does not change as the gate voltage changes, and a method for manufacturing the same.

Problems to be solved by the present disclosure are not limited to the above-mentioned problem(s), and other problem(s), which is (are) not mentioned above, may be clearly understood by those skilled in the art from the following descriptions.

According to an aspect of the present disclosure, the semiconductor device with multiple zero differential transconductance includes: a conductive substrate; a first insulating layer and a second insulating layer disposed on the conductive substrate; a first semiconductor and a second semiconductor disposed on first portions of the first insulating layer and the second insulating layer, respectively; a first buffer layer and a second buffer layer disposed on electrode contact areas of the first semiconductor and the second semiconductor, respectively; and an anode electrode and a cathode electrode disposed on second portions, which are different from the first portions, of the first insulating layer and the second insulating layer and on the first buffer layer and the second buffer layer, respectively, wherein the first semiconductor and the second semiconductor are disposed in parallel with each other and connected by the anode electrode and the cathode electrode.

A dielectric constant of the first insulating layer and the second insulating layer may be different from each other.

A geometric structure of the first insulating layer and the second insulating layer may be different from each other.

A band structure of the first semiconductor and the second semiconductor may be different from each other.

A doping process of the first semiconductor and the second semiconductor may be different from each other.

The first buffer layer and the second buffer layer may be formed by modifying the electrode contact areas of the first semiconductor and the second semiconductor, respectively.

The first buffer layer and the second buffer layer may be disposed on the electrode contact areas of the first semiconductor and the second semiconductor using a different material from the first semiconductor and the second semiconductor, respectively.

The semiconductor device may further include: a third insulating layer disposed between the first insulating layer and the conductive substrate; and a fourth insulating layer disposed between the second insulating layer and the conductive substrate.

The third insulating layer may have a band structure to block a carrier drifting between the first insulating layer and the conductive substrate, and the fourth insulating layer may have a band structure to block a carrier drifting between the second insulating layer and the conductive substrate.

According to another aspect of the present disclosure, the method of manufacturing a semiconductor device with multiple zero differential transconductance includes: forming a first insulating layer and a second insulating layer on a conductive substrate; forming a first semiconductor and a second semiconductor on first portions of the first insulating layer and the second insulating layer, respectively; forming a first buffer layer and a second buffer layer on electrode contact areas of the first semiconductor and the second semiconductor, respectively; and forming an anode electrode and a cathode electrode on second portions, which are different from the first portions, of the first insulating layer and the second insulating layer and on the first buffer layer and the second buffer layer, respectively, wherein the first semiconductor and the second semiconductor are disposed in parallel with each other and connected by the anode electrode and the cathode electrode.

A dielectric constant of the first insulating layer and the second insulating layer may be different from each other.

A geometric structure of the first insulating layer and the second insulating layer may be different from each other.

A band structure of the first semiconductor and the second semiconductor may be different from each other.

A doping process of the first semiconductor and the second semiconductor may be different from each other.

The first buffer layer and the second buffer layer may be formed by modifying the electrode contact areas of the first semiconductor and the second semiconductor, respectively.

The first buffer layer and the second buffer layer may be formed on the electrode contact areas of the first semiconductor and the second semiconductor using a different material from the first semiconductor and the second semiconductor, respectively.

The method may further include: forming a third insulating layer between the first insulating layer and the conductive substrate before forming the first insulating layer; and forming a fourth insulating layer between the second insulating layer and the conductive substrate before forming the second insulating layer.

The third insulating layer may have a band structure to block a carrier drifting between the first insulating layer and the conductive substrate, and the fourth insulating layer may have a band structure to block a carrier drifting between the second insulating layer and the conductive substrate.

Other features and aspects will be apparent from the following detailed description and the claims.

BRIEF DESCRIPTION OF THE DRAWINGS

The above and other aspects, features and other advantages of the present disclosure will be more clearly understood from the following detailed description taken in conjunction with the accompanying drawings.

FIGS. 1A to 4B are views for explaining the semiconductor device with multiple zero differential transconductance according to an exemplary embodiment of the present disclosure.

FIGS. 5A to 9B are views for explaining the semiconductor device with multiple zero differential transconductance according to another exemplary embodiment of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Those skilled in the art may make various modifications to the present disclosure and the present disclosure may have various embodiments thereof, and thus specific embodiments will be illustrated in the drawings and described in detail in the detailed description. However it should be understood that the present disclosure is not limited to the specific embodiments, but includes all changes, equivalents, or alternatives which are included in the spirit and technical scope of the present invention. In the description of respective drawings, similar reference numerals designate similar elements.

Terms such as first, second, A, or B may be used to describe various components but the components are not limited by the above terms. The above terms are used only to distinguish one component from the other component. For example, without departing from the scope of the present disclosure, a first component may be referred to as a second component, and similarly, a second component may be referred to as a first component. The term "and/or" includes combinations of a plurality of related elements or any one of the plurality of related elements.

It should be understood that, when it is described that an element is "coupled" or "connected" to another element, the element may be directly coupled or directly connected to the other element or coupled or connected to the other element through a third element. In contrast, when it is described that an element is "directly coupled" or "directly connected" to another element, it should be understood that no element is not present therebetween.

Terms used in the present application are used only to describe a specific exemplary embodiment, but are not intended to limit the present invention. A singular form may include a plural form if there is no clearly opposite meaning in the context. In the present application, it should be understood that term "include" or "have" indicates that a feature, a number, a step, an operation, a component, a part or the combination thereof described in the specification is present, but do not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terms which are defined in a generally used dictionary should be interpreted to have the same meaning as the meaning in the context of the related art but are not interpreted as an ideally or excessively formal meaning if it is not clearly defined in the present invention.

The present disclosure discloses a semiconductor device with multiple zero differential transconductance, a method for manufacturing a semiconductor device to have zero differential transconductance, a method for forming a specific zero differential transconductance state in a desired gate region, and a method for forming a plurality of zero differential transconductance states.

Specifically, according to the semiconductor device of the exemplary embodiment of the present disclosure and a manufacturing method of the same, it is possible to implement a multiple zero differential transconductance device, which is controllable to have three or more drain current saturation regions in a desired region by adjusting a threshold voltage VTH of each semiconductor included in the semiconductor device and forming a region, in which a drain current is constant with respect to the change of the gate voltage to connect semiconductors having different threshold voltages in parallel.

Hereinafter, exemplary embodiments according to the present disclosure will be described in detail with reference to accompanying drawings.

FIGS. 1A to 4B are views for explaining the semiconductor device with multiple zero differential transconductance according to an exemplary embodiment of the present disclosure.

Figure 1A:
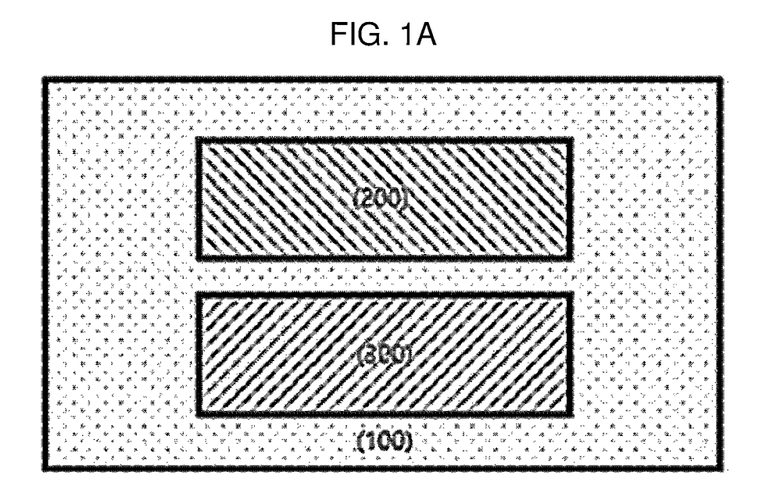
Figure 1B:
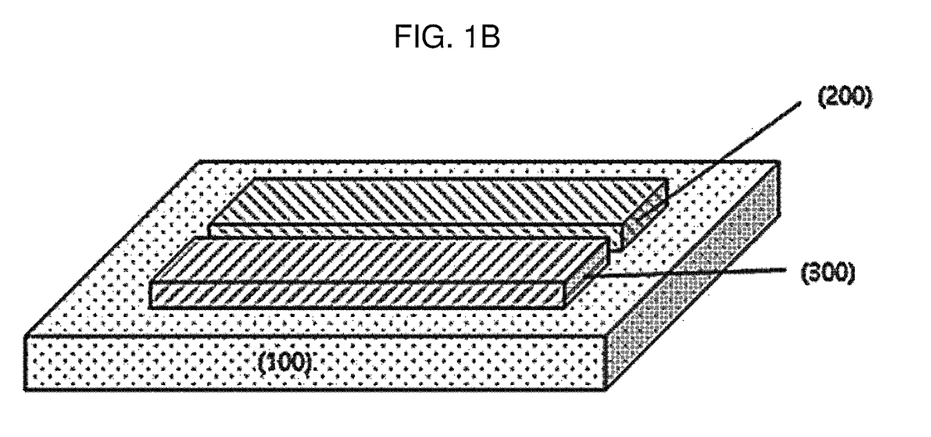

FIGS. 1A and 1B are a plan view and a perspective view of the conductive substrate, respectively, on which the first insulating layer and the second insulating layer are formed, according to an exemplary embodiment of the present disclosure.

Referring to FIGS. 1A and 1B, in the semiconductor device according to the exemplary embodiment of the present disclosure, the first insulating layer 200 and the second insulating layer 300 are disposed on the conductive substrate 100. At this time, the first insulating layer 200 and the second insulating layer 300 may have different dielectric constants or geometric structures (for example, thicknesses).

In the meantime, the conductive substrate 100 may be a substrate, on which a silicon (Si) or germanium (Ge) substrate or a conductive layer such as gold (Au), platinum (Pt), or copper (Cu), is disposed.

In the meantime, when each insulating layer 200, 300 is an oxide insulating layer such as silicon dioxide ($SiO_2$), aluminum oxide ($Al_2O_3$), or hafnium oxide ($HfO_2$), each of the insulating layers 200, 300 may be formed on the conductive substrate 100 by a dry or wet thermal oxidation, sputtering, atomic layer deposition process, or the like.

If each of the insulating layers 200 or 300 is a two-dimensional insulator such as hexagonal boron nitride (h-BN), the insulating layer may be formed on the conductive substrate 100 by means of exfoliation using a tape, chemical vacuum deposition such as CVD, substitution of graphene with boron and nitrogen elements, or the like.

Further, for the process for adjusting the thickness of each of the insulating layers 200 or 300, a growing time may vary for every region or dry etching using plasma or wet etching using etchant may be used.

Figure 2A:
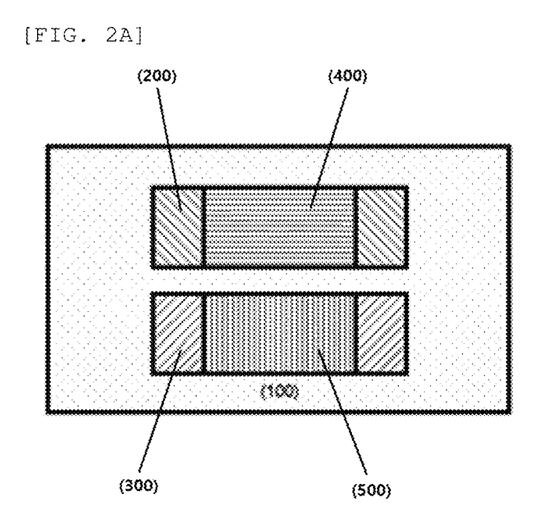
Figure 2B:
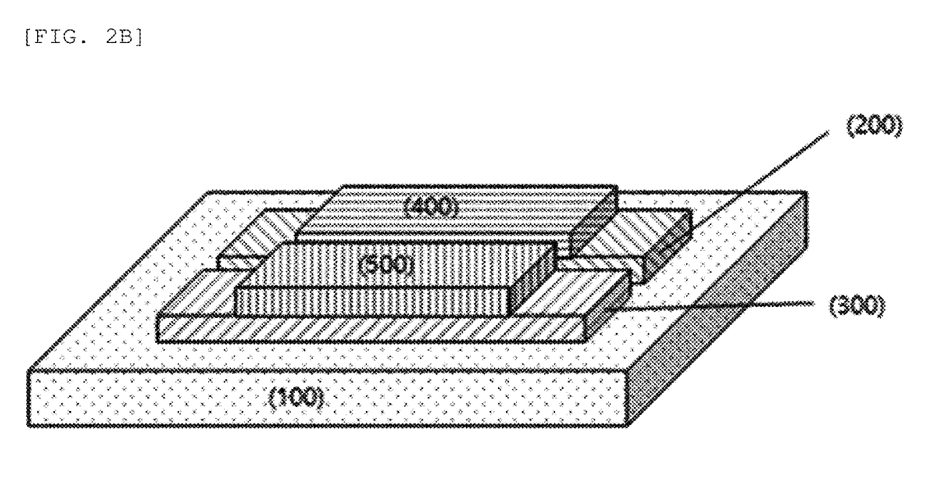

FIGS. 2A and 2B are a plan view and a perspective view of the conductive substrate, respectively, on which the first semiconductor and the second semiconductor are formed after the process of FIGS. 1A and 1B.

Referring to FIGS. 2A and 2B, the first semiconductor 400 may be disposed on a part of an upper area of the first insulating layer 200 and a second semiconductor 500 may be disposed on a part of an upper area of the second insulating layer 300. The first semiconductor 400 and the second semiconductor 500 may have different threshold voltages due to different band structures or different doping processes, or the difference between the first insulating layer 200 and the second insulating layer 300.

If each of the semiconductors 400, 500 is silicon, germanium, III-V group semiconductor, oxide semiconductor, or organic semiconductor, each of the semiconductors may be disposed on the first insulating layer 200 and the second insulating layer 300, respectively, by thermal evaporation, e-beam evaporation, sputtering, chemical vapor deposition, spin coating, or the like.

In the meantime, if each of the semiconductors 400, 500 is a transition metal chalcogen compound, graphene, or black phosphorus material, each of the semiconductors may be disposed on the first insulating layer 200 and the second insulating layer 300, respectively, by exfoliation using a tape, chemical vapor deposition such as CVD, or impregnation using a chalcogen element as transition metal.

Further, in order to shift a threshold voltage of each of the semiconductors 400 or 500 material, ion implantation, diffusion, surface charge transfer doping on a surface by means of formation of a film layer, doping using plasma or chemicals (plasma doping or chemical doping), electrostatic doping using charge trapping of an insulating layer by light energy and an electric field irradiated onto the insulating layer may be utilized.

Figure 3A:
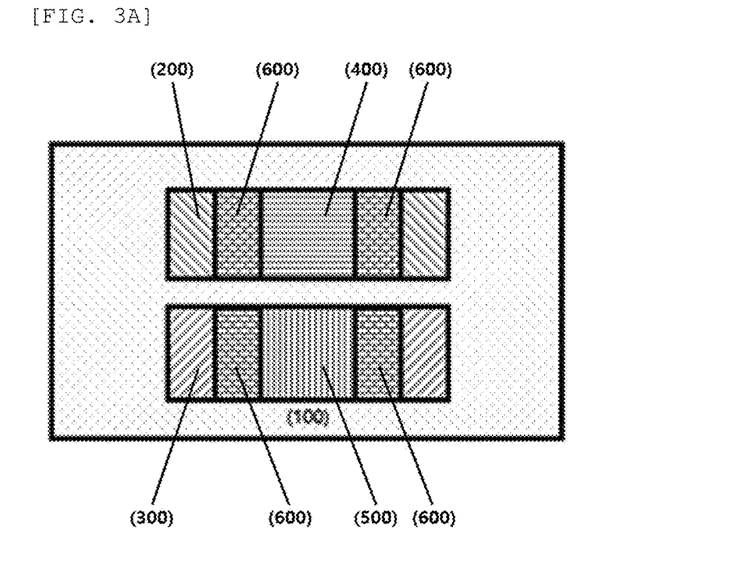
Figure 3B:
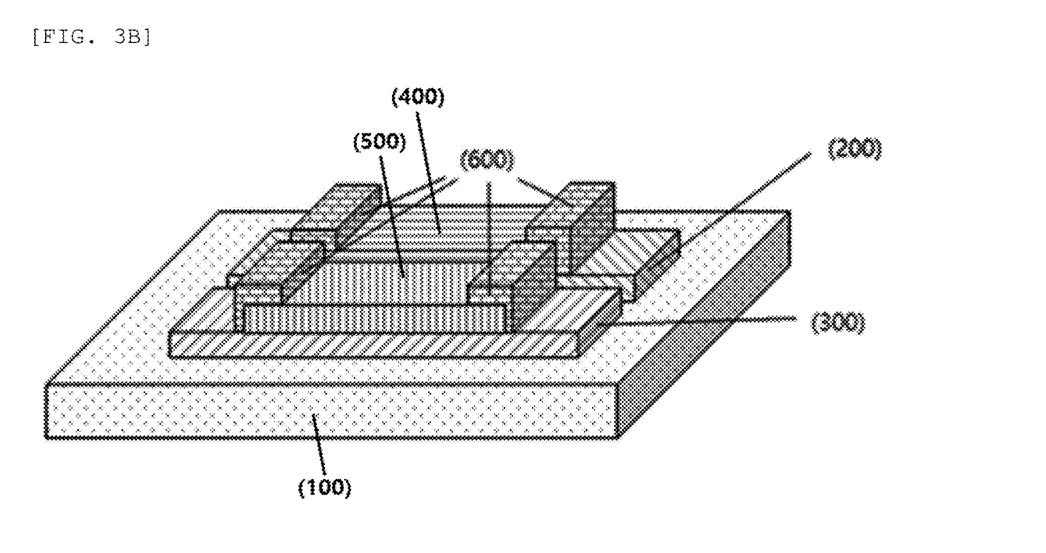

FIGS. 3A and 3B are a plan view and a perspective view of the conductive substrate, respectively, on which the first buffer layer and the second buffer layer are disposed on electrode contact areas of the first semiconductor and the second semiconductor, respectively, after the process of FIG. 2.

Referring to FIGS. 3A and 3B, the first buffer layer and the second buffer layer 600 may be disposed on each of the electrode contact area of the first semiconductor 400 and the second semiconductor 500, respectively. Each of the first buffer layer and the second buffer layer 600 includes a material, which controls the device to inject carriers, and is formed by modifying source/drain contact areas of the first semiconductor 400 and the second semiconductor 500 or formed on the source/drain contact areas.

Figure 4A:
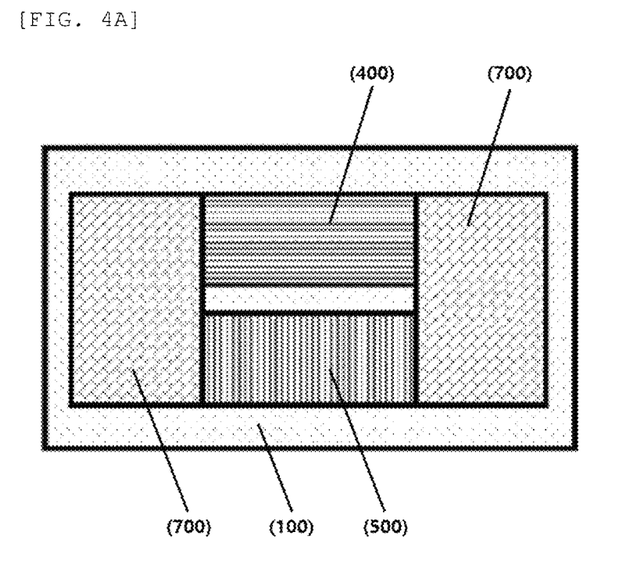
Figure 4B:
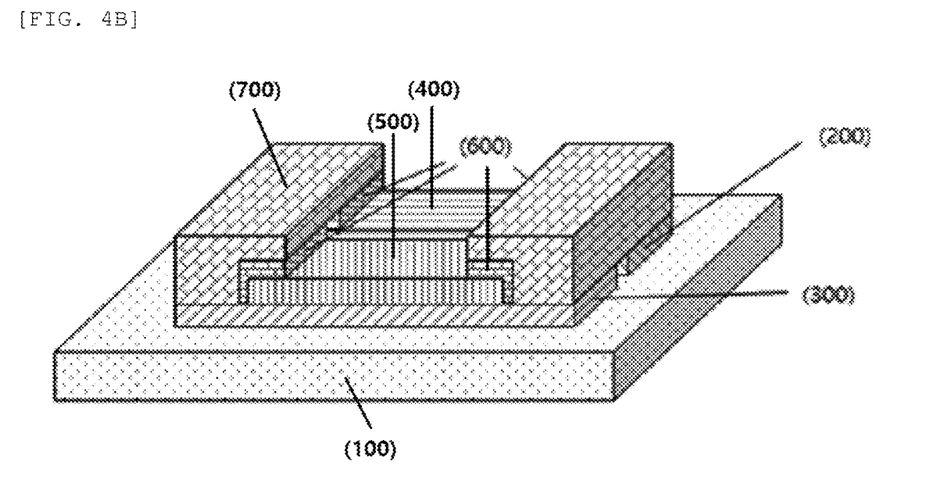

FIGS. 4A and 4B are a plan view and a perspective view of the conductive substrate, respectively, on which the metal electrode is formed after the process of FIGS. 3A and 3B.

Referring to FIGS. 4A and 4B, the metal electrodes 700 may be formed such that the first semiconductor 400 and the second semiconductor 500 are disposed in parallel with each other and connected by the metal electrodes 700. For example, the anode electrode 700 and the cathode electrode 700 may be disposed on external surfaces of the first buffer layer 600 and the second buffer layer 600, respectively.

The semiconductor device according to the exemplary embodiment of the present disclosure may utilize one of thermal evaporation, e-beam evaporation, sputtering, and chemical vapor deposition, to form the electrode.

In an inverter of the related art, which is implemented by a negative differential transconductance device, a ratio between a load and a voltages VDD distributed to the negative differential transconductance device varies, as an input voltage Vin increases. As a result, a magnitude and a region of each logic state of the inverter are not accurately controlled. Therefore, it may be difficult to increase the number of logic states to a predetermined level or higher.

However, an inverter using the semiconductor device with multiple zero differential transconductance according to the exemplary embodiment of the present disclosure shows a plurality of logic states in the semiconductor device. As a result, the inverter may have a plurality of stable logic states. Accordingly, the semiconductor device of the present disclosure has effects of enabling chip size reduction, lower power consumption, higher speed, and the like.

FIGS. 5A to 9B are views for explaining the semiconductor device with multiple zero differential transconductance according to another exemplary embodiment of the present disclosure.

The semiconductor device according to another exemplary embodiment of the present disclosure includes a third insulating layer disposed between the first insulating layer and the conductive substrate and a fourth insulating layer disposed between the second insulating layer and the conductive substrate.

Figure 5A:
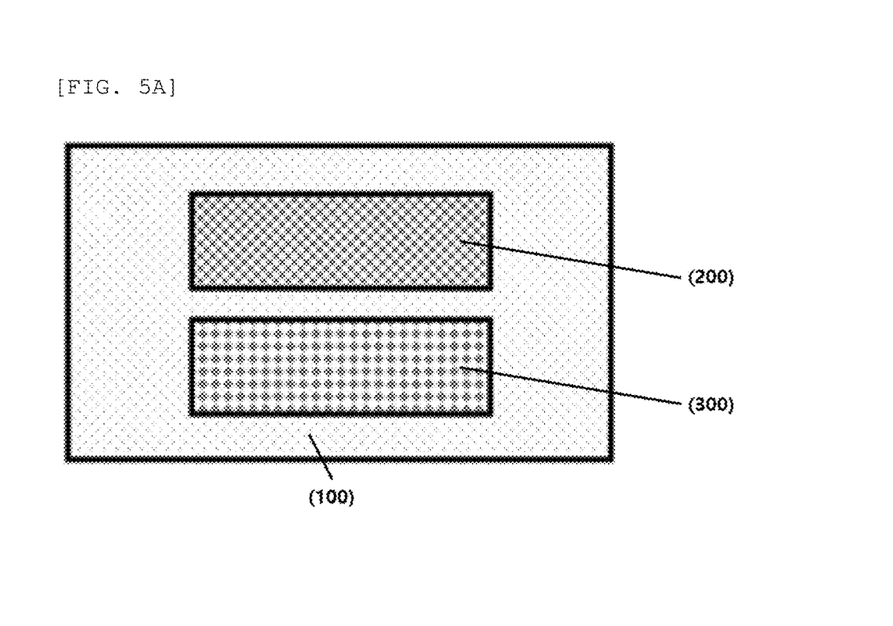
Figure 5B:
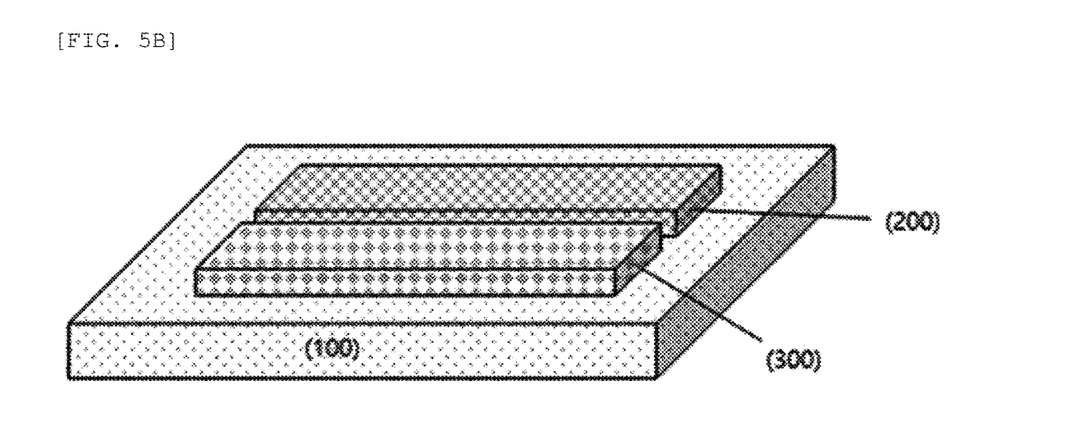

FIGS. 5A and 5B are a plan view and a perspective view of a conductive substrate, respectively, on which the third insulating layer and the fourth insulating layer are disposed, according to another exemplary embodiment of the present disclosure.

Referring to FIGS. 5A and 5B, in the semiconductor device according to the exemplary embodiment of the present disclosure, the third insulating layer 200 and the fourth insulating layer 300 are disposed on the conductive substrate 100. This process corresponds to the process of forming the first insulating layer 200 and the second insulating layer 300 of FIG. 1, so that a detailed description will be omitted.

Figure 6A:
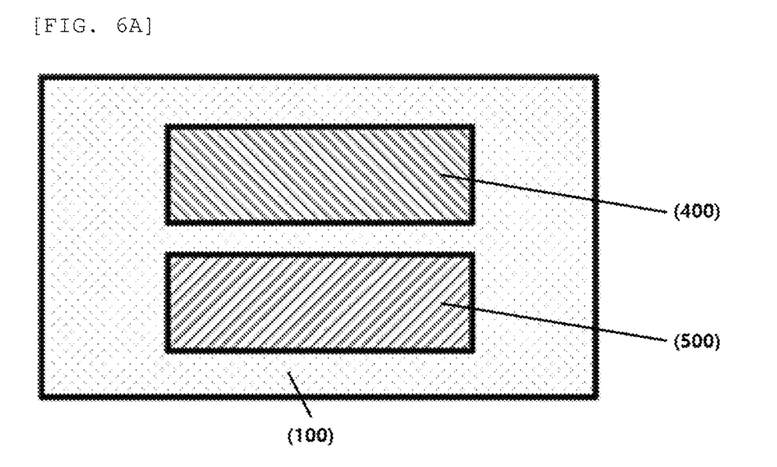
Figure 6B:
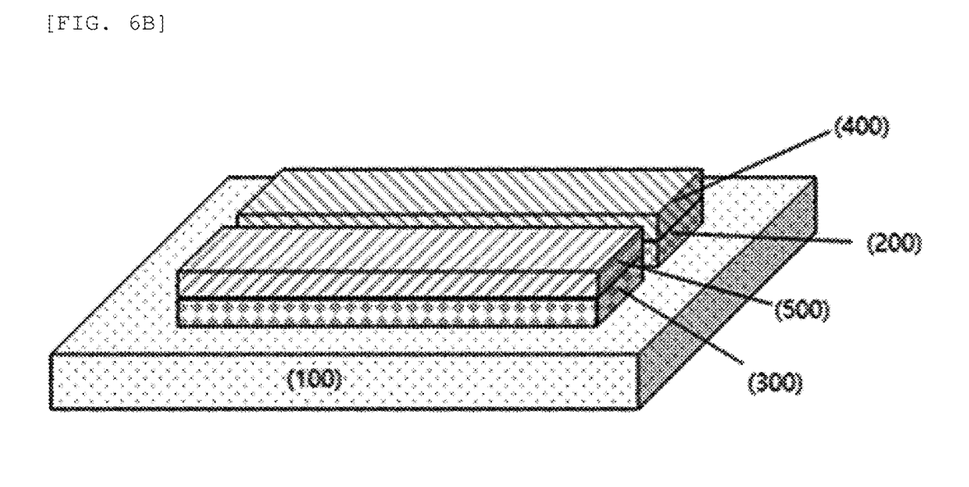

FIGS. 6A and 6B are a plan view and a perspective view of the conductive substrate, respectively, on which the first insulating layer and the second insulating layer are disposed, according to another exemplary embodiment of the present disclosure.

The semiconductor device according to another exemplary embodiment of the present disclosure includes the first insulating layer 400 disposed on the third insulating layer 200 and the second insulating layer 500 disposed on the fourth insulating layer 300. At this time, the first insulating layer 400 and the third insulating layer 200, and the second insulating layer 500 and the fourth insulating layer 300 may have different dielectric constants or geometric structures. Further, the third insulating layer 200 and the fourth insulating layer 300 may form a band structure so as to block the carrier drifting between the first insulating layer 400 and the second insulating layer 500 and the conductive substrate 100.

Figure 7A:
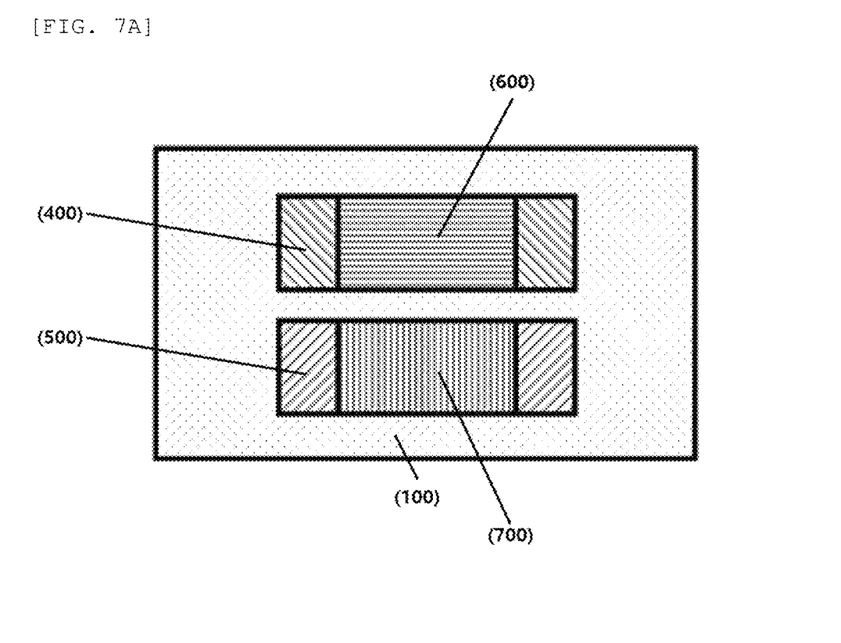
Figure 7B:
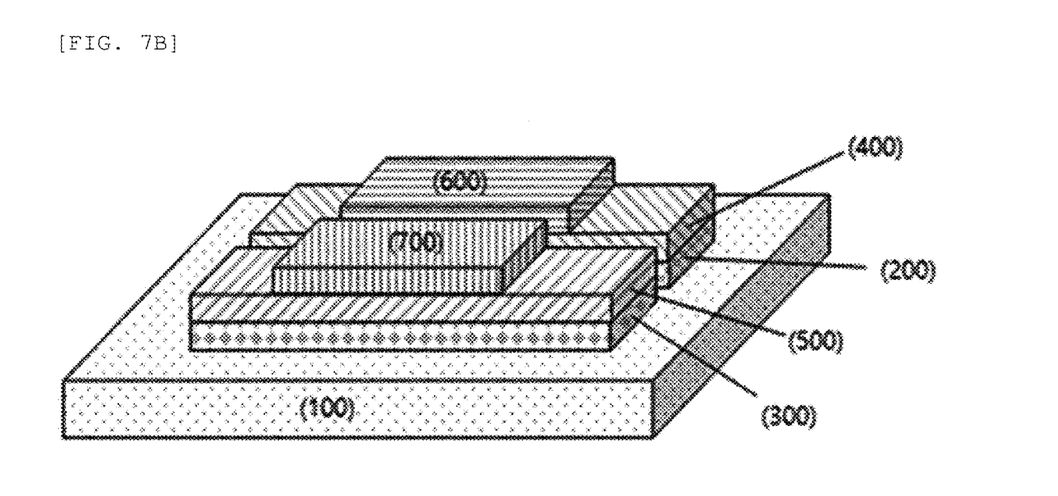

FIGS. 7A and 7B are a plan view and a perspective view of a conductive substrate, respectively, on which the first semiconductor and the second semiconductor are formed after the process of FIGS. 6A and 6B.

The process of forming the first semiconductor 600 and the second semiconductor 700 after the process of FIGS. 6A and 6B corresponds to the process of forming the first semiconductor 400 and the second semiconductor 500 of FIGS. 2A and 2B, so that a detailed description will be omitted.

Figure 8A:
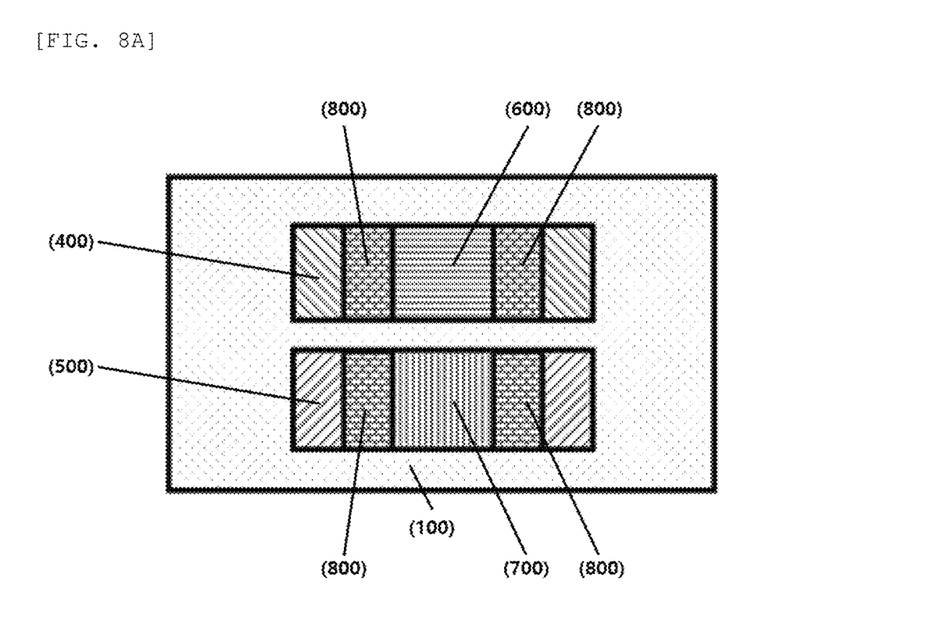
Figure 8B:
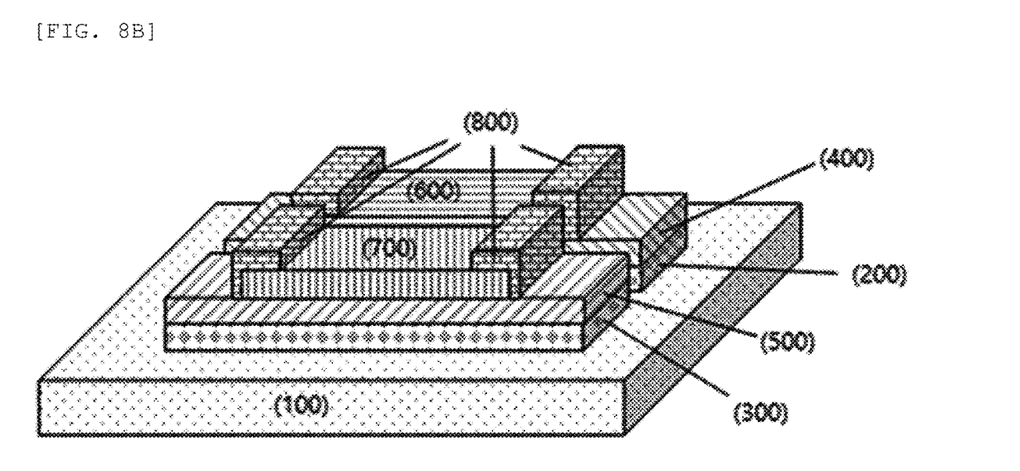

FIGS. 8A and 8B are a plan view and a perspective view of a conductive substrate, respectively, on which buffer layers are disposed on electrode contact areas of the first semiconductor and the second semiconductor after the process of FIGS. 7A and 7B.

The process of forming the buffer layers 800 after the process of FIGS. 7A and 7B corresponds to the process of forming the buffer layers 600 of FIGS. 3A and 3B, so that a detailed description will be omitted.

Figure 9A:
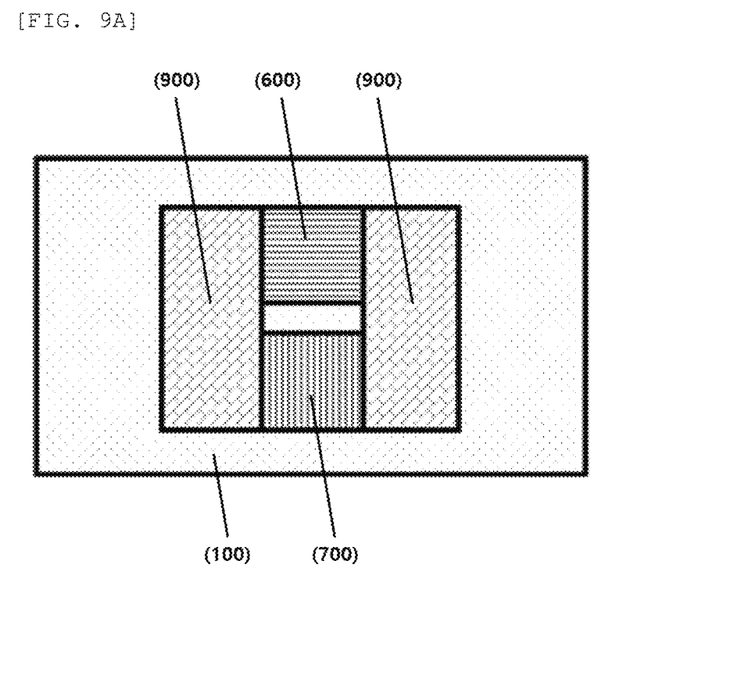
Figure 9B:
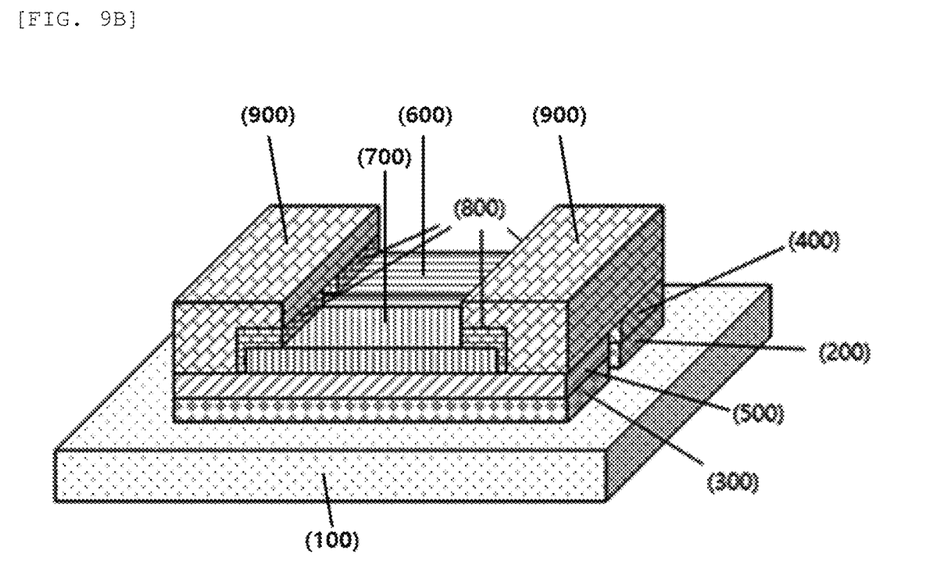

FIGS. 9A and 9B are a plan view and a perspective view of a conductive substrate, respectively, on which the metal electrode is formed after the process of FIGS. 8A and 8B.

The process of forming the metal electrode 900 after the process of FIGS. 8A and 8B corresponds to the process of forming the metal electrode 700 of FIGS. 4A and 4B, so that a detailed description will be omitted.

By doing this, according to the exemplary embodiments of the present disclosure, the buffer layers 600 and 800 are added to each electrode contact area of the semiconductor 400 and 500 so that, when a drain current and a gate voltage are applied, the carrier injection from the anode electrode 700 and the cathode electrode 700 is restricted to implement the zero differential transconductance phenomenon.

This is because in a subthreshold region, which is the beginning of switching-on, an amount of injected carriers is increased, but the increase of the amount of injected carriers is restricted due to the resistive unit (an energy barrier) disposed in the electrode contact area, so that even though the gate voltage is increased, the drain current constantly flows near the linear region.

Further, the semiconductor device with the multiple zero differential transconductance of the present disclosure may be applicable to a transistor based on a material including silicon, III-V group compounds, organic materials, and the like.

In the meantime, the structure of the zero differential transconductance device disclosed in the present disclosure is not limited to the structure illustrated in FIGS. 1A to 9B. For example, in the structure described above, a position, where the electrode, the insulating layer, and the semiconductor are formed, may be opposite (that is, a top gate structure may be formed).

Figure 10:
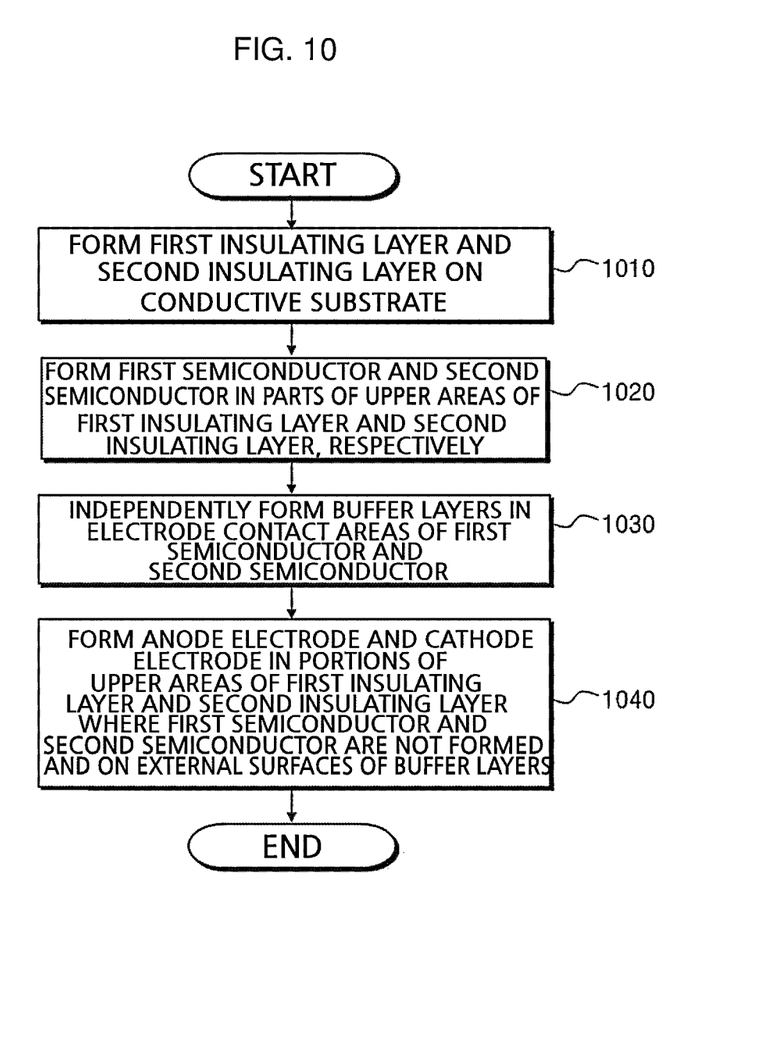
FIG. 10 is a flowchart for explaining the method of manufacturing the semiconductor device with multiple zero differential transconductance according to an exemplary embodiment of the present disclosure.

FIG. 10 is a flowchart for explaining the method of manufacturing the semiconductor device with multiple zero differential transconductance according to an exemplary embodiment of the present disclosure.

In step 1010, the first insulating layer and the second insulating layer may be formed on a conductive substrate. Here, at least one of dielectric constants and geometric structures of the first insulating layer and the second insulating layer may be different.

In step 1020, the first semiconductor and the second semiconductor may be formed in parts of upper areas of the first insulating layer and the second insulating layer. Here, at least one of band structures and doping processes of the first semiconductor and the second semiconductor may be different.

In step 1030, the first buffer layer and the second buffer layer are formed on the electrode contact areas of the first semiconductor and the second semiconductor, respectively. Here, the first buffer layer and the second buffer layer may be formed by modifying electrode contact areas of the first semiconductor and the second semiconductor or formed on the electrode contact areas of the first semiconductor and the second semiconductor.

In step 1040, an anode electrode and a cathode electrode may be formed on parts of the upper areas of the first insulating layer and the second insulating layer, where the first semiconductor and the second semiconductor are not formed, and on external surfaces of the first buffer layer and the second buffer layer. Here, the first semiconductor and the second semiconductor are disposed in parallel with each other and connected by the anode electrode and the cathode electrode.

In the meantime, the method of manufacturing the semiconductor device according to another exemplary embodiment of the present disclosure may further include a step of forming the third insulating layer between the first insulating layer and the conductive substrate and a step of forming the fourth insulating layer between the second insulating layer and the conductive substrate. In this case, the third insulating layer and the fourth insulating layer may have a band structure to block the carrier drifting between the first insulating layer and the conductive substrate, and between the second insulating layer and the conductive substrate, respectively.

Figure 11A:
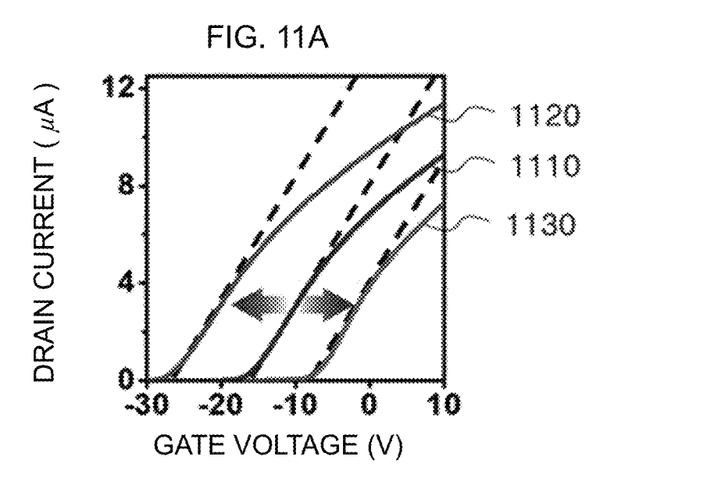
FIGS. 11A to 11C are views for explaining a change in a drain current according to a gate voltage of the semiconductor device during a process of implementing a multiple zero differential transconductance according to another exemplary embodiment of the present disclosure.
Figure 11B:
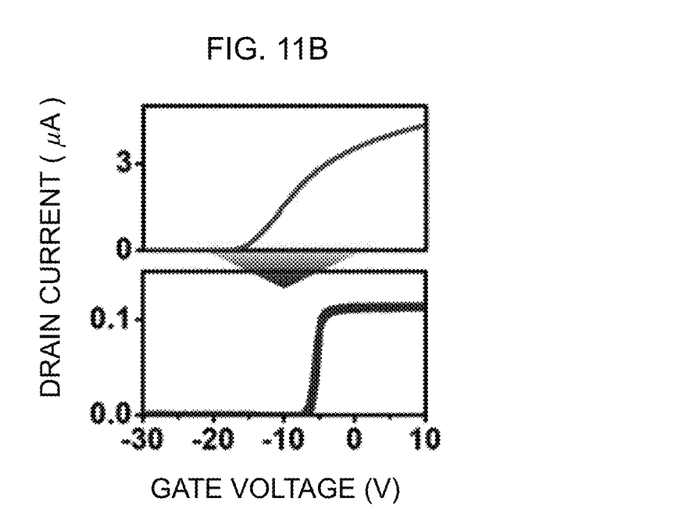
Figure 11C:
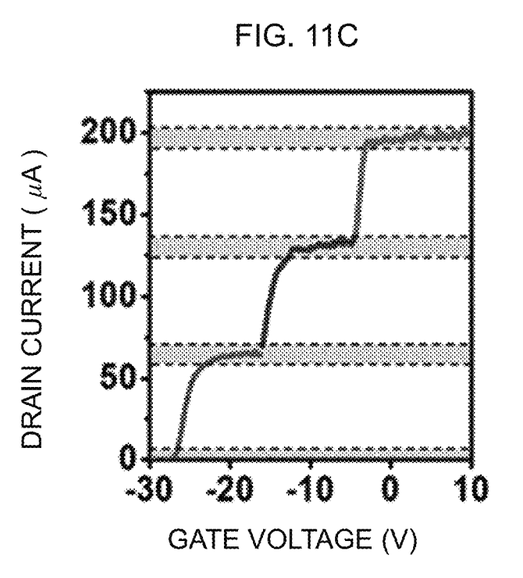

FIGS. 11A to 11C are views for explaining a change in a drain current according to a gate voltage of the semiconductor device during a process of implementing a multiple zero differential transconductance according to another exemplary embodiment of the present disclosure.

The present disclosure discloses a non-linear transconductance semiconductor device having stepwise zero differential transconductance by connecting a plurality of semiconductors having different threshold voltages in parallel while saturating a drain current for the gate voltage by utilizing a method of saturating the drain current for the gate voltage by inserting a buffer layer into the contact area of a unipolar transistor to restrict the injection of the carrier and a method for shifting the threshold voltage by changing a dielectric constant or the thickness of the insulating layer or adjusting a quantity of electric charge therein, and a manufacturing method of the same.

For example, the semiconductor device according to the exemplary embodiment of the present disclosure may have a structure, in which a plurality of semiconductors is connected in parallel. At this time, each semiconductor may be implemented to show zero differential transconductance by forming molybdenum disulfide ($MoS_2$) on a hexagonal boron nitride (h-BN) insulating layer and forming a buffer layer on the molybdenum disulfide.

In the meantime, a channel threshold voltage of each semiconductor may be implemented to be different from each other using photodoping, which is generated by hexagonal boron nitride, which will be described in more detail with reference to FIG. 11A.

Referring to FIG. 11A, in a situation, where light energy is irradiated onto the hexagonal boron nitride insulating layer, when gate electric fields having different magnitudes and directions are applied, and if the light is turned off, in the molybdenum disulfide channel, the gate voltage 1110 is changed as represented by a first curve 1120 or a second curve 1130. Channel threshold voltages of the semiconductor according to the exemplary embodiment of the present disclosure may be formed to be different from each other using this phenomenon. In the meantime, even though it is illustrated that the above-described semiconductor adjusts the threshold voltage using light energy, it is obvious to those skilled in the art that it is also implemented by other methods such as ion implantation, diffusion, surface charge transfer doping on a surface by means of formation of a film layer, doping using chemicals (chemical doping), electrostatic doping using charge trapping of an insulating layer by light energy and an electric field irradiated onto the insulating layer.

FIG. 11B is a graph illustrating a gate voltage-current characteristic when a buffer layer is formed in a contact area by an argon plasma treatment before forming an anode/cathode electrode on a channel layer of each semiconductor.

Referring to FIG. 11B, the carrier drifting between the electrode and the channel layer is restricted by the inserted buffer layer so that it may be confirmed that zero differential transconductance, in which the drain current is not changed regardless of the change of the gate voltage, is shown.

FIG. 11C is a graph illustrating a gate voltage-current characteristic when three semiconductors are connected in parallel.

Referring to FIG. 11C, it may be confirmed that the semiconductor device according to the exemplary embodiment of the present disclosure has multiple zero differential transconductance having three different threshold voltages and three current saturation regions.

The semiconductor device according to the exemplary embodiment of the present disclosure has a multiple zero differential transconductance having a plurality of drain current saturation regions in which the drain current is constant with respect to the change of the gate voltage so that an inverter including the semiconductor device of the present disclosure has a plurality of stable logic states, which may result in the reduction of the size of the chip, a lower power consumption, and a higher speed.

Further, the semiconductor device disclosed in the present disclosure freely forms a plurality of zero differential transconductance states in a desired gate voltage region to easily implement a multinary logic circuit (for example, a multinary inverter, a NAND, or the like) having three or more stable logic states.

The effects of the present disclosure are not limited to the aforementioned effects, and various other effects are included within a range which is obvious to those skilled in the art from the following description.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device with multiple zero differential transconductance, the semiconductor device comprising:
    a conductive substrate;
    a first insulating layer and a second insulating layer disposed on the conductive substrate;
    a first semiconductor and a second semiconductor disposed on upper portions of the first insulating layer and the second insulating layer, respectively, the first semiconductor and the second semiconductor comprising electrode contact areas;
    a first buffer layer and a second buffer layer disposed on the electrode contact areas of the first semiconductor and the second semiconductor, respectively; and
    an anode electrode and a cathode electrode disposed on the upper portions of the first insulating layer and the second insulating layer where the first semiconductor and the second semiconductor are not formed, and on surfaces of the first buffer layer and the second buffer layer,
    wherein the first semiconductor and the second semiconductor are disposed in parallel with each other and connected by the anode electrode and the cathode electrode,
    wherein the anode electrode connects to the first buffer layer and the second buffer layer, and the cathode electrode connects to the first buffer layer and the second buffer layer, and
    wherein the semiconductor device further comprises a plurality of drain current saturation regions in which the drain current is constant with respect to a change of gate voltage such that the semiconductor device has a plurality of stable logic states.

2. The semiconductor device of claim 1, wherein a dielectric constant of the first insulating layer and the second insulating layer are different from each other.

3. The semiconductor device of claim 1, wherein a geometric structure of the first insulating layer and the second insulating layer are different from each other.

4. The semiconductor device of claim 1, wherein a band structure of the first semiconductor and the second semiconductor are different from each other.

5. The semiconductor device of claim 1, wherein a doping process of the first semiconductor and the second semiconductor are different from each other.

6. The semiconductor device of claim 1, wherein the first buffer layer and the second buffer layer are formed by modifying the electrode contact areas of the first semiconductor and the second semiconductor, respectively.

7. The semiconductor device of claim 1, wherein the first buffer layer and the second buffer layer are disposed on the electrode contact areas of the first semiconductor and the second semiconductor using a different material from the first semiconductor and the second semiconductor, respectively.

8. The semiconductor device of claim 1, further comprising:
a third insulating layer disposed between the first insulating layer and the conductive substrate; and
a fourth insulating layer disposed between the second insulating layer and the conductive substrate.

9. The semiconductor device of claim 8,
wherein the third insulating layer comprises a band structure to block a carrier drifting between the first insulating layer and the conductive substrate, and
wherein the fourth insulating layer comprises a band structure to block a carrier drifting between the second insulating layer and the conductive substrate.

10. A method of manufacturing a semiconductor device with multiple zero differential transconductance, the method comprising:
forming a first insulating layer and a second insulating layer on a conductive substrate;
forming a first semiconductor and a second semiconductor in upper portions of the first insulating layer and the second insulating layer, respectively, the first semiconductor and the second semiconductor comprising electrode contact areas;
forming a first buffer layer and a second buffer layer in the electrode contact areas of the first semiconductor and the second semiconductor, respectively; and
forming an anode electrode and a cathode electrode on portions of the first insulating layer and the second insulating layer where the first semiconductor and the second semiconductor are not formed, and on surfaces of the first buffer layer and the second buffer layer,
wherein the first semiconductor and the second semiconductor are disposed in parallel with each other and connected by the anode electrode and the cathode electrode,
wherein the anode electrode connects to the first buffer layer and the second buffer layer, and the cathode electrode connects to the first buffer layer and the second buffer layer, and
wherein the semiconductor device further comprises a plurality of drain current saturation regions in which the drain current is constant with respect to a change of gate voltage such that the semiconductor device has a plurality of stable logic states.

11. The method of claim 10, wherein a dielectric constant of the first insulating layer and the second insulating layer are different from each other.

12. The method of claim 10, wherein a geometric structure of the first insulating layer and the second insulating layer are different from each other.

13. The method of claim 10, wherein a band structure of the first semiconductor and the second semiconductor are different from each other.

14. The method of claim 10, wherein a doping process of the first semiconductor and the second semiconductor are different from each other.

15. The method of claim 10, wherein the first buffer layer and the second buffer layer are formed by modifying the electrode contact areas of the first semiconductor and the second semiconductor, respectively.

16. The method of claim 10, wherein the first buffer layer and the second buffer layer are formed on the electrode contact areas of the first semiconductor and the second semiconductor using a different material from the first semiconductor and the second semiconductor, respectively.

17. The method of claim 10, further comprising:
forming a third insulating layer between the first insulating layer and the conductive substrate before forming the first insulating layer; and
forming a fourth insulating layer between the second insulating layer and the conductive substrate before forming the second insulating layer.

18. The method of claim 17,
wherein the third insulating layer comprises a band structure to block a carrier drifting between the first insulating layer and the conductive substrate, and
wherein the fourth insulating layer comprises a band structure to block a carrier drifting between the second insulating layer and the conductive substrate.

* * * * *